(12) United States Patent
Weng

(10) Patent No.: US 9,703,627 B2
(45) Date of Patent: Jul. 11, 2017

(54) ERROR CORRECTION CODE UNIT, SELF-TEST METHOD AND ASSOCIATED CONTROLLER APPLIED TO FLASH MEMORY DEVICE FOR GENERATING SOFT INFORMATION

(71) Applicant: Silicon Motion Inc., Hsinchu County (TW)

(72) Inventor: Chen-Yu Weng, Kaohsiung (TW)

(73) Assignee: Silicon Motion Inc., Hsinchu County (TW)

( * ) Notice: Subject to any disclaimer, the term of this patent is extended or adjusted under 35 U.S.C. 154(b) by 204 days.

(21) Appl. No.: 14/551,060

(22) Filed: Nov. 23, 2014

(65) Prior Publication Data

US 2015/0155058 A1 Jun. 4, 2015

(30) Foreign Application Priority Data

Nov. 29, 2013 (TW) .............................. 102143853 A

(51) Int. Cl.

| G11C 29/00 | (2006.01) |
|---|---|
| G06F 11/00 | (2006.01) |
| G06F 11/10 | (2006.01) |
| G11C 7/02 | (2006.01) |
| G11C 11/56 | (2006.01) |
| G11C 29/42 | (2006.01) |
| G11C 29/50 | (2006.01) |
| G06F 11/22 | (2006.01) |

(52) U.S. Cl.
CPC ...... *G06F 11/1044* (2013.01); *G06F 11/1048* (2013.01); *G06F 11/2215* (2013.01); *G11C 7/02* (2013.01); *G11C 11/5642* (2013.01); *G11C 29/42* (2013.01); *G11C 29/50004* (2013.01)

(58) Field of Classification Search
CPC ............. G06F 11/1044; G06F 11/1048; G06F 11/2215; G11C 7/02; G11C 11/5642; G11C 29/42; G11C 29/50004
USPC ....... 714/739, 741, 718, 733, 703, 719, 721, 714/734, 738, 752, 758, 763, 766
See application file for complete search history.

(56) References Cited

U.S. PATENT DOCUMENTS

| 7,421,636 | B2 | 9/2008 | Kang | |
|---|---|---|---|---|
| 2006/0059404 | A1* | 3/2006 | Cavanna | H03M 13/00 714/758 |
| 2009/0249148 | A1* | 10/2009 | Ito | G06F 11/2215 714/746 |
| 2009/0282305 | A1* | 11/2009 | Chen | G06F 11/1068 714/718 |
| 2011/0119560 | A1 | 5/2011 | Lee | |
| 2014/0281762 | A1* | 9/2014 | Norrie | G06F 11/2215 714/703 |

FOREIGN PATENT DOCUMENTS

| CN | 101405810 A | 4/2009 |
|---|---|---|
| CN | 102160120 A | 8/2011 |
| CN | 102543208 A | 7/2012 |

* cited by examiner

*Primary Examiner* — Christine Tu
(74) *Attorney, Agent, or Firm* — Winston Hsu

(57) ABSTRACT

A self-test method of a flash memory device includes: generating input data; encoding the input data to generate an error correction code; utilizing the input data and the error correction code to simulate to read a page of a flash memory of the flash memory device to generate soft information; and decoding the soft information to generate a decoding result.

16 Claims, 5 Drawing Sheets

ERROR CORRECTION CODE UNIT, SELF-TEST METHOD AND ASSOCIATED CONTROLLER APPLIED TO FLASH MEMORY DEVICE FOR GENERATING SOFT INFORMATION

BACKGROUND OF THE INVENTION

1. Field of the Invention

The present invention relates to a flash memory, and more particularly, to a self-test method of a flash memory device.

2. Description of the Prior Art

A flash memory can store data through operations of electronically erasing and writing/programing. The flash memory is widely applied to electronic products such as memory cards, solid-state drives (SSDs) and portable multimedia players. Since the flash memory is a non-volatile memory, it does not need additional power to keep the information stored therein. Further, the flash memory is capable of providing fast data read and better shock-resistive ability. Hence, based on at least the above characteristics, the reason why the flash memory is so popular can be explained.

Flash memories can be divided into NOR flash memories and NAND flash memories. The NAND flash memory has shorter erase and program time, and each memory cell thereof requires a smaller chip area. Hence, compared with the NOR flash memory, the NAND flash memory has higher storage density and lower cost per storage unit. In general, the flash memory utilizes memory cell arrays to store data bits. The memory cell is implemented by a floating-gate transistor, and each memory cell may set the required threshold voltage of turning on the floating-gate transistor through appropriately controlling the number of charges on the floating gate of the floating-gate transistor, to store the information of a single bit or multiple bits. In this way, when one or multiple predetermined control gate voltages are applied to the control gate of the floating gate transistor, the conduction state of the floating-gate transistor will indicate one or multiple binary digits stored in the gloating-gate transistor.

However, some factors might affect/disturb the number of charges originally stored in the flash memory cell. For example, the interference existing in the flash memory may come from the write/program disturbance, read disturbance and/or retention disturbance. Taking a NAND flash memory composed of memory cells each having more than one bit stored therein for example, a physical memory page includes multiple logical memory pages, and each of the logic memory pages utilizes one or multiple control gate voltages to perform a read operation. For example, regarding a flash memory cell used for storing 3-bit information, the flash memory cell will have one of 8 states (i.e., charge levels) respectively corresponding to different numbers of charges (i.e., different threshold voltages). However, due to the program/erase (P/E) count and/or data retention time, the threshold voltage distribution of the flash memory cell will change. Hence, reading information stored in the memory cell according to the original control gate voltage setting may not correctly obtain the stored information due to the change of the threshold voltage distribution.

The aforementioned change or shift of the threshold voltage distribution usually results in data read errors, and this problem can be improved by utilizing error correction code (ECC) and soft decoding. However, due to the reduction on the current manufacture process of the flash memories, it becomes easier to encounter errors during the procedure of soft recording preformed on data read from the flash memories. Hence, how to provide a low-cost and efficient testing method becomes an important issue in the pertinent field.

SUMMARY OF THE INVENTION

Hence, one of the objects of the present invention is to provide an error correction code unit of a flash memory device, where the error correction code unit has a very small chip area, and is capable of generating a great quantity of data very similar to the data actually read from the flash memory, thus enabling the flash memory device to perform self-test before leaving the factory, to determine the read and decode qualities of the flash memory device.

According to an embodiment of the present invention, an error correction code unit of a flash memory device code unit includes an encoder, a self-test circuit and a decoder. The encoder is used for encoding received input data to generate an error correction code. The self-test circuit is coupled to the encoder, and arranged for generating the input data to the encoder, receiving the error correction code from the encoder, and utilizing the input data and the error correction code to simulate to read a page of a flash memory of the flash memory device to generate soft information. The decoder is coupled to the self-test circuit, and arranged for receiving the soft information and decoding the soft information to generate a decoding result.

According to another embodiment of the present invention, a self-test method of a flash memory device includes: generating input data; encoding the input data to generate an error correction code; utilizing the input data and the error correction code to simulate to read a page of a flash memory of the flash memory device to generate soft information; and decoding the soft information to generate a decoding result.

According to yet another embodiment of the present invention, a controller for controlling access of a flash memory device includes a read only memory (ROM), a microprocessor and an error correction code unit. The ROM is used for storing a program code. The microprocessor is used for executing the program code to control the access of the flash memory and manage a plurality of blocks of the flash memory. The error correction code unit is coupled to the microprocessor. The error correction code unit includes an encoder, a self-test circuit and a decoder. The encoder is used for encoding received input data to generate a corresponding error correction code. The self-test circuit is coupled to the encoder, and arranged for generating the input data to the encoder, receiving the error correction code from the encoder, and utilizing the input data and the error correction code to simulate to read a page of a flash memory of the flash memory device to generate soft information, The decoder is coupled to the self-test circuit, and arranged for receiving the soft information and decoding the soft information to generate a decoding result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
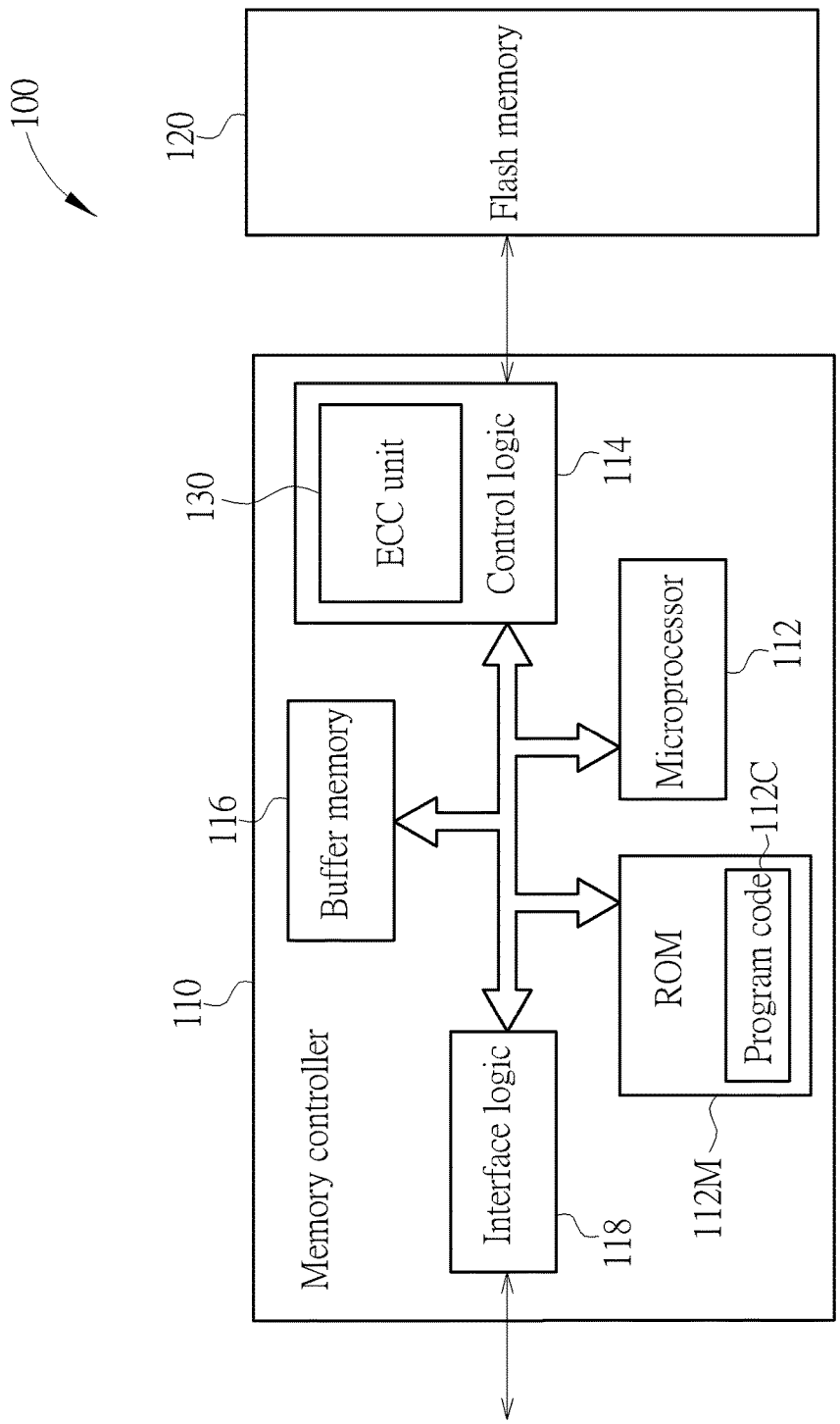
FIG. 1 is a diagram illustrating a memory device according to an embodiment of the present invention.

Please refer to FIG. 1, which is a diagram illustrating a memory device 100 according to an embodiment of the present invention. More particularly, the memory device 100 in this embodiment can be a portable memory device (e.g., a memory card in compliance with the SD/MMC, CF, MS or XD standard). The memory device 100 includes a flash memory 120 and a controller. The controller may be a memory controller 110 used to access (read/write) the flash memory 120. According to this embodiment, the memory controller 110 includes a microprocessor 112, a read only memory (ROM) 112M, a control logic 114, a buffer memory 116 and an interface logic 118. The read only memory 112M is used to store a program code 112C, and the microprocessor 112 is used to control the access of the flash memory 120. Further, the control logic 114 includes an error correcting code (ECC) unit 130.

Under a typical situation, the flash memory 120 includes a plurality of blocks, and the controller (e.g., the memory controller 110 which executes the program code 112C through the microprocessor 112) performs the block-based operations, including data copying, data erasing and data combining. Further, a block can record a specific quantity of pages, wherein the controller (e.g., the memory controller 110 which executes the program code 112C through the microprocessor 112) performs the page-based write operation to the flash memory 120.

In practice, the memory controller 110 which executes the program code 112C through the microprocessor 112 can utilize inner elements thereof to perform various control operations, such as utilizing the control logic 114 to control the access operation of the flash memory 120 (especially, the access operation of at least one block or at least one page), utilizing the buffer memory 116 to perform the required buffering operation, and utilizing the interface logic 118 to communicate with a host device.

Figure 2:
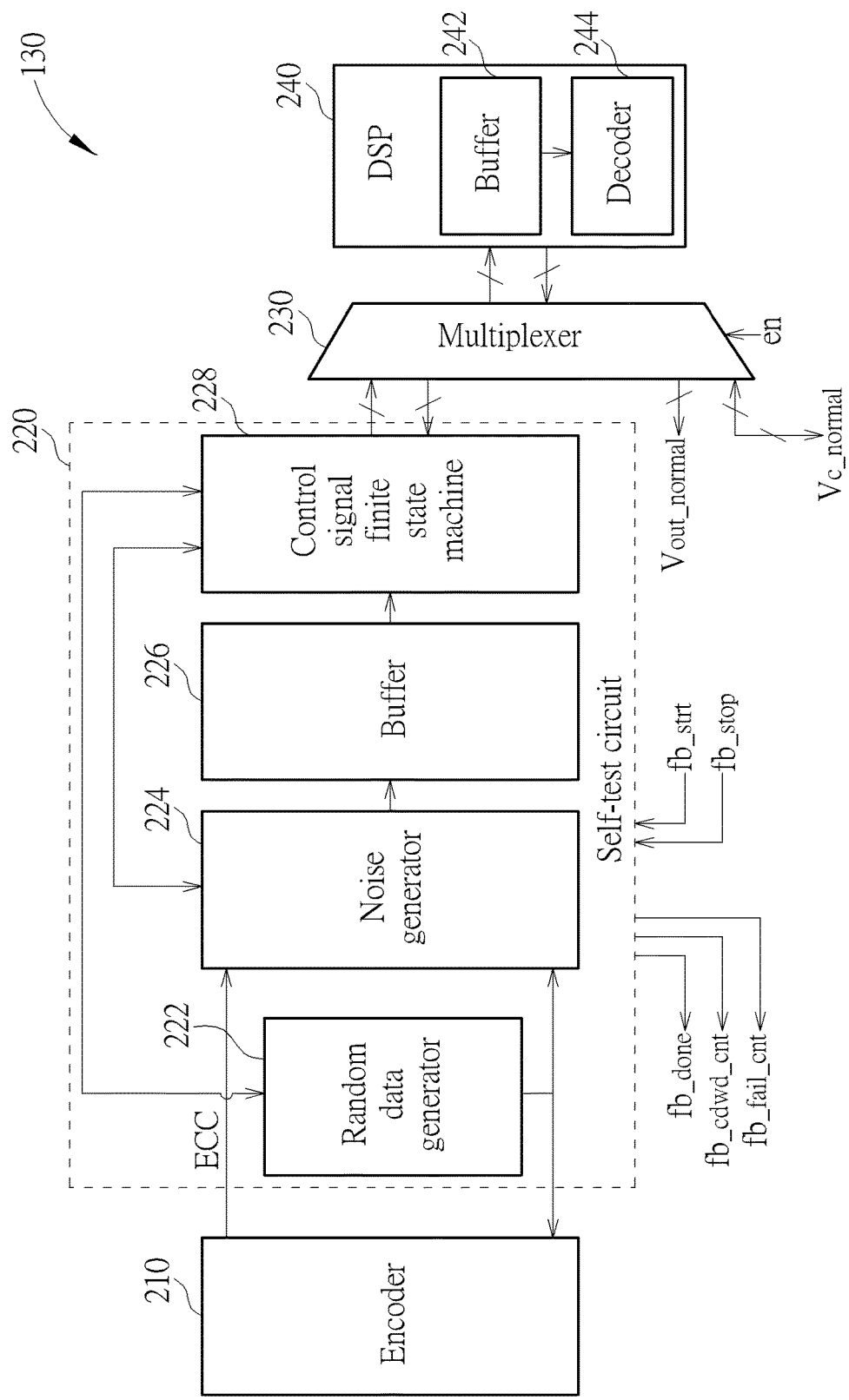
FIG. 2 is a diagram illustrating an error correction code unit according to an embodiment of the present invention.

Further, please refer to FIG. 2, which is a diagram illustrating an ECC unit 130 according to an embodiment of the present invention. As shown in FIG. 2 the ECC unit 130 includes an encoder 210, a self-test circuit 220, a multiplexer 230 and a digital signal processor (DSP) 240, wherein the self-test circuit 220 includes a random data generator 222, a noise generator 224, a buffer 226 and a control signal finite state machine 228, and the digital signal processor 240 includes a buffer 242 and a decoder 244. The operations of ECC unit 130 can be categorized into two modes, a self-test mode and a normal operation mode. When the ECC unit 130 is in the self-test mode, the self-test circuit 220 will generate an enabling signal en to the multiplexer 230, so that the digital signal processor 240 may receive data from the self-test circuit 220. The self-test circuit 220 and the encoder 210 will generate test data to the digital signal processor 240, such that the required test result is generated accordingly. When the ECC unit 130 is in the normal operation mode, all or part of the functions of the self-test circuit 220 will be disabled, and the multiplexer 230 will make the digital signal processor 240 receive an input control signal Vc_normal inputted by the memory controller 110 which is operated normally and accordingly generate an output signal Vout_normal to other circuits in the memory controller 110. The following paragraphs will describe the details of operations of aforementioned two modes.

Firstly, the self-test mode is utilized to test whether the function of the decoder 244 in the digital signal processor 240 is normal. That is, the self-test mode is utilized to test whether the decoder 244 is capable of correctly decoding the data to obtain the correct data when the quality of the data read from the flash memory 120 is poor. In this embodiment, in order to save the amount of usage of the memory and fully test the function of the decoder 244, the self-test circuit 220 utilizes the random data generator 222 and the noise generator 2244 to use a smaller amount of data to generate a large amount of data similar to the data actually read from the flash memory 120, especially the soft information read from the flash memory 120.

The following example will illustrate the definition of the "software information". Please refer to FIG. 3, which is a diagram illustrating reading of the soft information of a memory cell in the flash memory according to an embodiment of the present invention, wherein the memory cell is implemented by a floating-gate transistor, the curve 302 represents the threshold voltage probability distribution when the memory cell records the information "0," and the curve 304 represents the threshold voltage probability distribution when the memory cell records the information "1". Please note that the threshold voltage distributions (i.e., the curves 302 and 304) may change, shift or sometimes even overlap with each other due to the program/erase (P/E) count and/or the data retention time. Hence, the memory controller 110 will apply 7 different voltages V1-V7 to the gate of the memory cell (floating-gate transistor), and generate corresponding bit values according to whether the current of the memory cell is detected. For example, if there is current generated in the memory cell when the voltages V1, V3, V5 and V7 are applied to the memory cell (i.e. , the voltages V1, V3, V5 and V7 are larger than the threshold voltage value of the memory cell) , and there is no current generated in the memory cell when the voltages V2, V4 and V6 are applied to the memory cell (i.e. , the voltages V2, V4 and V6 are smaller than the threshold voltage value of the memory cell), the soft information read from the memory cell will be "1010101". Further, if there is current generated in the memory cell when voltages V1-V7 are applied to the memory cell (i.e., voltages V1-V7 are all larger than the threshold voltage value of the memory cell) , the soft information read from the memory cell will be "1111111" . Please note that the above details for illustrating the soft information are merely for illustrative purposes. In other embodiments of the present invention, the number of applied voltages is not limited to 7.

Further, with regard to the structure of the flash memory 120, the flash memory 120 includes a plurality of blocks, wherein each of the blocks includes multiple pages, each of the pages includes multiple sectors, and each of the sectors includes multiple memory cells. The "block" is utilized as the smallest erase unit, and the "page" is utilized as the smallest read/write unit (i.e., whole contents of a page must be read at a time while reading the page). Hence, the random data generator 222 and the noise generator 224 in FIG. 2 are utilized to simulate the soft information read from all memory cells in one page. More specifically, the random data generator 222 and the noise generator 224 will initially simulate that the memory controller uses the voltage V1 to read each memory cell in a page, to thereby generate a first set of data of the page. Next, the random data generator 222 and the noise generator 224 simulate that the memory controller 110 uses the voltage V2 to read each memory cell in the page, to thereby generate a second set of data of the page. Similarly, the random data generator 222 and the noise generator 224 simulate that the memory controller 110 utilizes the voltages V3, V4, V5, V6 and V7 to read each memory cell in the page, respectively, to thereby generate the respective third, fourth, fifth, sixth and seventh sets of data of the page. The first to seventh sets of data of the page form the soft information of each memory cell in the page.

Figure 4:
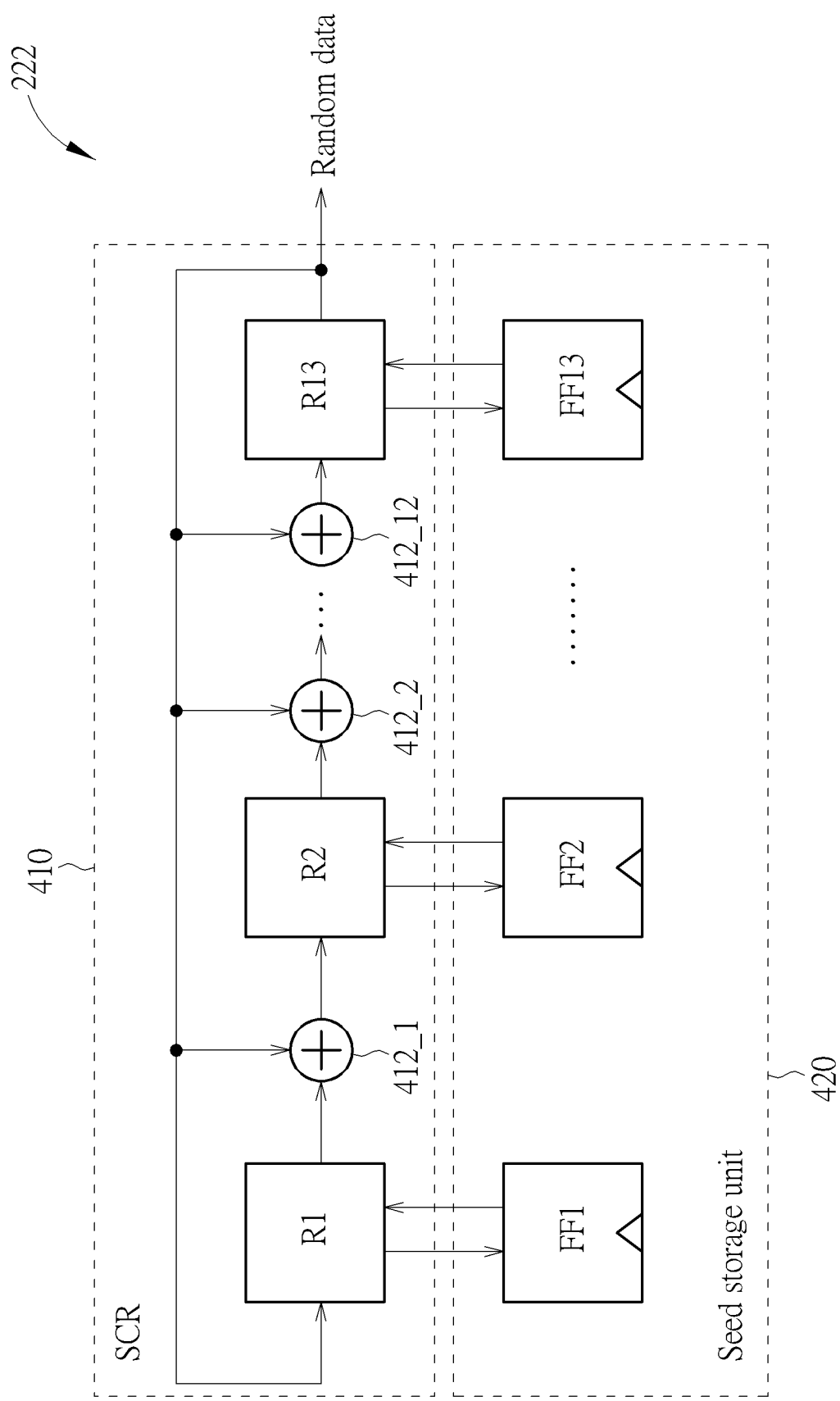
FIG. 4 is a diagram illustrating a random data generator according to an embodiment of the present invention.

In detail, please refer to FIG. 4. FIG. 4 is a diagram illustrating a random data generator 222 according to an embodiment of the present invention. As shown in FIG. 4, the random data generator 222 includes a scrambler (SCR) 410 and a seed storage unit 420, wherein the SCR 410 includes multiple registers R1-R13 and multiple adders 412_1-412_12, and the seed storage unit 420 includes flip flops FF1-FF13 connected to the registers R1-R13, respectively. In the following descriptions, the random data generator 222 is illustrated using the circuit structure shown in FIG. 4. However, the circuit structure of the random data generator 222 shown in FIG. 4 is not a limitation of the present invention. As long as similar data can be generated, the numbers of the registers, adders and flip flops in the random data generator 222 can be changed, and the random data generator 222 can be implemented in other manners.

When an engineer is ready to make the ECC unit 130 enter the self-test mode, he/she will input a self-test start signal fb_strt to the self-test circuit 220 in FIG. 2. When the self-test circuit 220 receives the self-test start signal fb_strt, the control signal finite state machine 228 will generate a first seed data to the seed storage unit 420 of the random data generator 222. In this embodiment, the first seed data may be "0000000000001," and these 13 bit values are stored in the flip flops FF1-FF13, respectively. Next, the SCR 410 will sequentially generate a first set of random data according to the first seed data. Besides, during the process of generating the first set of random data, the seed information stored in the flip flops FF1-FF13 continuously changes.

Then, the first set of random data generated by the random data generator 222 will be delivered to the encoder 210 and the noise generator 224, wherein the encoder 210 will encode the first set of random data to generate a corresponding error correction code, and then output the generated ECC to the noise generator 224. In short, the data received by the noise generator 220 is exactly the first set of random data and the corresponding ECC thereof. In an embodiment of the present invention, the data received by the noise generator 224 is similar to the data contents (which include multiple sets of data and corresponding ECCs) in a page of the flash memory 120. For example, if a page of the flash memory 120 includes 8 sectors, and each sector has 1 KB (kilobyte) data which includes a 120-bit ECC, the data received by the noise generator 224 will be similar to the data contents of the above-mentioned page. Next, the noise generator 224 adds a noise component (i.e., an error amount) to the received first set of random data and corresponding ECC thereof, so as to simulate the situation of actually reading data from the flash memory 120. For example, the noise generator 224 may be an additive white Gaussian noise (AWGN) circuit capable of changing partial contents of the received data, to make the received data have a certain level of error amount. For example, if a page has a row bit error rate equal to 0.01%, it means there are 90 error bits in a page.

As mentioned above, the data generated by the noise generator 224 can be viewed as a result of utilizing the voltage V1 to read a page, and the data generated by the noise generator 224 is inputted to the buffer 242 of the digital signal processor 240 through the buffer 226, the control signal finite machine 228 and the multiplexer 230.

Further, the noise generator 224 will record the positions and bit values of the error bits in the outputted data (e.g., recording them in the control signal finite state machine 228), in order to utilize them later.

Next, the control signal finite machine 228 generates the first seed data (e.g., the aforementioned "0000000000001") to the seed storage unit 420 of the random data generator 222 again. Similarly, the random data generator 222 generates a second set of random data according to the first seed data, wherein the second set of random data and the aforementioned first set of random data are generated by utilizing the same seed data. Hence, the second set of random data will be exactly the same as the first set of random data. Then, the random data generator 222 inputs the generated second set of random data to the encoder 210 to generate a corresponding ECC, and the noise generator 224 receives the second set of the random data and the corresponding ECC thereof. Next, the noise generator 224 adds noise to the second set of the random data and the corresponding ECC thereof, to simulate the result of using voltage V2 to read a page in FIG. 3. Since the noise generator 224 uses the voltage V2 to simulate the operation of reading the same page at this time, the positions of the error bit values thereof will depend on positions of the error bit values in the previous simulation of using the voltage V1 to read the page. Hence, the control signal finite machine 228 will transmit bit values of the previously stored error bits to the noise generator 224. The noise generator 224 will utilize the information to add noise to the second set of random data and the corresponding ECC thereof, and then output the processed data.

As mentioned above, the data generated by the noise generator 224 can be viewed as a result of using the voltage V2 to read a page, and the data generated by the noise generator 224 is inputted to the buffer 242 of the digital signal processor 240 through the buffer 226, the control signal finite machine 228 and the multiplexer 230.

Further, the noise generator 224 will record the positions and bit values of the error bits in the outputted data (e.g., recording them in the control signal finite state machine), in order to utilize them later.

Figure 3:
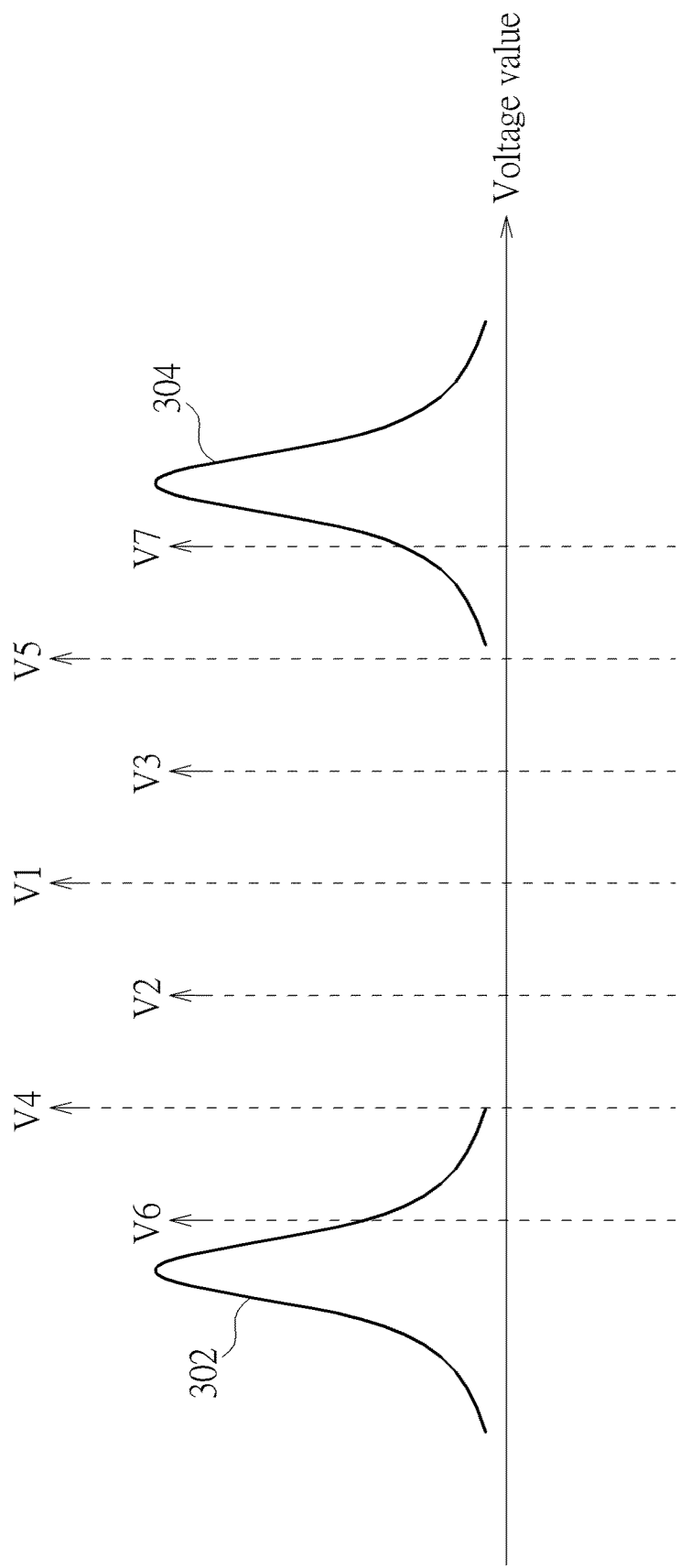
FIG. 3 is a diagram illustrating reading the soft information of a memory cell in the flash memory according to an embodiment of the present invention.

Similarly, the random data generator 222 will further utilize the first seed data to respectively generate a third, fourth, fifth, sixth and seventh sets of random data, which are respectively processed by the encoder 210 and the noise generator 224 to simulate the results of using the voltages V3, V4, V5, V6 and V7 to read the same page as shown in FIG. 3. The data generated by the noise generator 224 is inputted to the buffer 242 of the digital signal processor 240 through the buffer 226, the control signal finite machine 228 and the multiplexer 230.

After the digital signal processor 240 received the simulation result of using the voltages V1-V7 to read the same page as shown in FIG. 3, the decoder 244 will perform a soft decoding operation (e.g., the low density parity check (LDPC) decoding) on the data, to test whether the data can be successfully decoded.

The aforementioned operations of the self-test circuit 220 and the digital signal processer 240 can be viewed as simulating an actual read operation for data (soft information) of a page in the flash memory 120 and an actual following decoding operation of the data that are performed by the memory controller 110.

Next, the self-test circuit 220 repeats the aforementioned operations, and simulates the data read operation to generate soft information of a plurality of different pages to the decoder 244 for decoding. More specifically, the control signal finite state machine 228 may generate a second seed data (e.g., "0000000000010") to the seed storage unit 420 in the random data generator 222, and follow the aforementioned steps to generate soft information of another page to the decoder 244 for decoding. Then, the control signal finite state machine 228 may generate a third seed data (e.g., "0000000000011") to the seed storage unit 420 in the random data generator 222, and follow the aforementioned steps to generate soft information of another page to the decoder 244 for decoding, and so on. Based on engineer's setting, the self-test circuit 220 may simulate to generate a plurality of different pages (e.g., 10000 pages) to the decoder 244 for decoding.

When the engineer thinks the test needs to be stopped, a self-test completing signal fb_stop can be inputted to the self-test circuit 220 to stop generating data to the digital signal processor 240. At this time, the self-test circuit 220 will output a test completing signal fb_done, a test section count fb_cdwd_cnt and a section decoding failure count fb_fail_cnt, for the engineer's reference.

As describe above, since the self-test circuit 220 may simulate the read operation to generate a large amount of page data by merely using a small amount of seed data, the chip area of the self-test circuit can be greatly reduced to lower the cost. Further, since the data generated through simulation has high veracity, the test reliability can be increased.

On the other hand, when the ECC unit 130 is in the normal operation mode, at least a portion (e.g., part or all) of the functions of the self-test circuit 220 will be disabled. However, the encoder 210 and the decoder 244 in FIG. 2 can still work normally at this time. That is, the encoder 210 encodes the data that is going to be written into the flash memory 120 in advance, and then writes the encoded data into the flash memory 120. The decoder 244 is utilized to receive the input control signal Vc_normal, and decodes the encoded data read from the flash memory 120.

Figure 5:
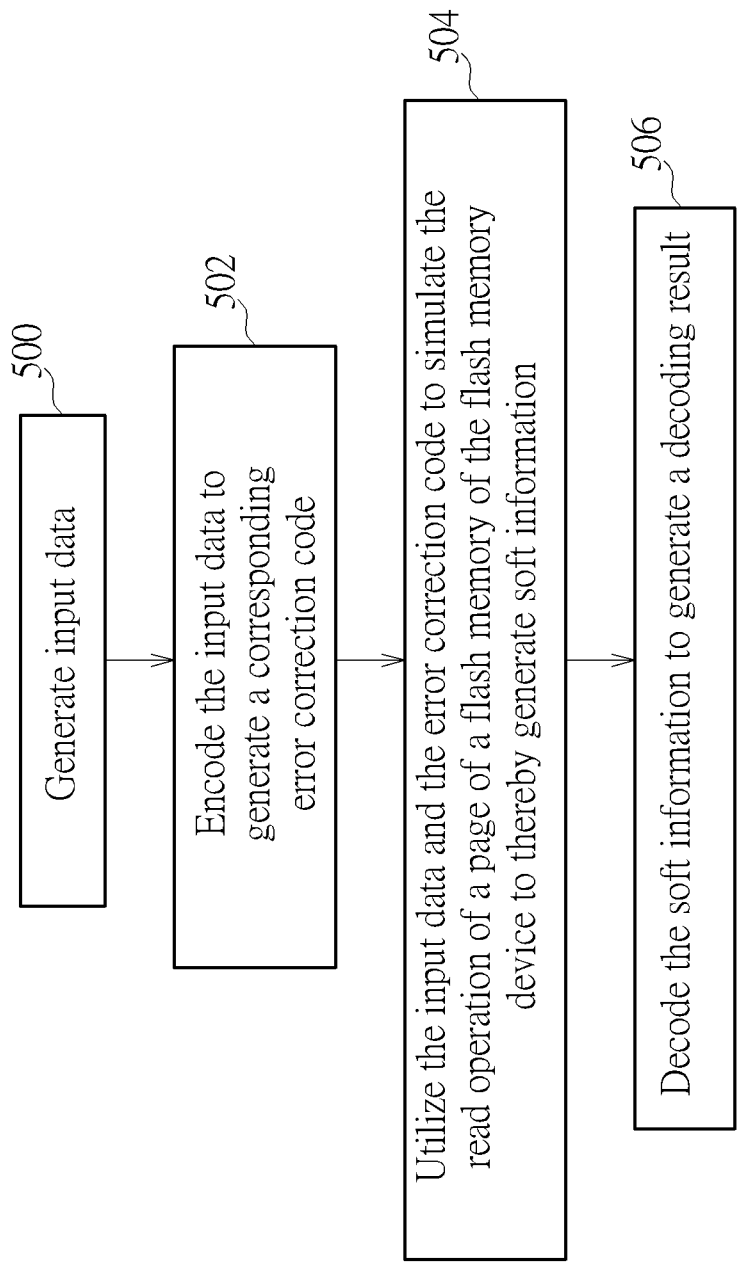
FIG. 5 is a flowchart illustrating a self-test method of a flash memory device according to an embodiment of the present invention.

Further, please refer to FIG. 5 and the illustrations corresponding to FIGS. 2-4. FIG. 5 is a flowchart illustrating a self-test method of a flash memory device according to an embodiment of the present invention. The self-test method in FIG. 5 may be summarized as follows.

Step 500: Generate input data;

Step 502: Encode the input data to generate a corresponding error correction code;

Step 504: Utilize the input data and the error correction code to simulate the read operation of a page of a flash memory of the flash memory device to thereby generate soft information; and Step 506: Decode the soft information to generate a decoding result.

In conclusion, concerning the ECC unit, self-test method and related controller applied to the flash memory device in the present invention, the seed data having a small data amount can be utilized to simulate the read operation of a page of a flash memory of the flash memory device to generate soft information. Hence, the related self-test circuit has a very small chip area, and is capable of generating a large amount of data very similar to the data actually read from the flash memory for enabling the flash memory device to perform self-test before it leaves the factory to determine the read quality and decoding quality of the flash memory device. Therefore, the self-test method and related circuit provided by the present invention indeed have advantages including low cost and high efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error correction code (ECC) unit of a flash memory device, comprising:
    an encoder, for receiving input data and encoding the received input data to generate an error correction code;
    a self-test circuit, coupled to the encoder, the self-test circuit arranged for generating the input data to the encoder, receiving the error correction code from the encoder, and utilizing the input data and the error correction code to simulate a reading result of a page of a flash memory of the flash memory device to generate soft information; and
    a decoder, coupled to the self-test circuit, the decoder arranged for directly receiving the soft information from the self-test circuit, without accessing the flash memory, and decoding the soft information to generate a decoding result.

2. The ECC unit of claim 1, wherein the self-test circuit comprises:
    a random data generator, arranged for generating a plurality of sets of random data as the input data; and
    a noise generator, coupled to the random data generator, the noise generator arranged for adding noise component to the plurality of sets of random data and the error correction code, to stimulate the reading result of the page of the flash memory of the flash memory device to generate the soft information.

3. The ECC unit of claim 2, wherein the random data generator utilizes a same seed data to generate the plurality of sets of random data, respectively; and each set of the plurality of sets of random data has same contents.

4. The ECC unit of claim 3, wherein the noise generator simultaneously records positions and bit values of error bits while adding noise component to each of the plurality of sets of random data; and while the noise generator adds noise component to an $N^{th}$ set of random data, the noise generator refers to positions and bit values of error bits that are recorded when the noise generator adds noise component to $1^{st}$ to $(N-1)^{th}$ sets of random data, where N is an integer larger than 1.

5. The ECC unit of claim 1, wherein the self-test circuit simulates the reading result of the page when a plurality of different voltage values are used to read the page respectively, to generate the soft information.

6. A self-test method of a flash memory device comprising:
    generating input data;
    encoding the input data to generate an error correction code;
    providing a self-test circuit to utilize the input data and the error correction code to simulate a reading result of a page of a flash memory of the flash memory device to generate soft information; and
    directly receiving, by a decoder, the soft information from the self-test circuit, without accessing the flash memory, and decoding the soft information to generate a decoding result.

7. The self-test method of claim 6, wherein the step of generating the input data comprises:
generating a plurality of sets of random data as the input data.

8. The self-test method of claim 7, wherein the step of generating the plurality of sets of random data as the input data comprises:
utilizing a same seed data to generate the plurality of sets of random data, respectively, wherein each set of the plurality of sets of random data has same contents.

9. The self-test method of claim 7, wherein the step of utilizing the input data and the error correction code to simulate the reading result of the page of the flash memory of the flash memory device to generate the soft information comprises:
adding noise component to the plurality of sets of random data and the error correction code, to simulate the reading result of the page of the flash memory of the flash memory device to generate the soft information.

10. The self-test method of claim 9, wherein the step of adding noise component to the plurality of sets of random data and the error correction code, to simulate the reading result of the page of the flash memory of the flash memory device to generate the soft information comprises:
simultaneously recording positions and bit values of error bits while adding noise component to each of the plurality of sets of random data;
while adding noise component to an $N^{th}$ set of random data, referring to positions and bit values of error bits that are recorded when adding noise component to $1^{st}$ to $(N-1)^{th}$ sets of random data, where N is an integer larger than 1.

11. The self-test method of claim 6, wherein the step of utilizing the input data and the error correction code to simulate the reading result of the page of the flash memory of the flash memory device to generate the soft information comprises:
utilizing the input data and the error correction code to simulate the reading result of the page when a plurality of different voltage values are used to read the page respectively, to generate the soft information.

12. A controller for controlling access of a flash memory, the controller comprising:
a read only memory (ROM), arranged for storing a program code;
a microprocessor, arranged for executing the program code to control the access of the flash memory and manage a plurality of blocks of the flash memory; and
an error correction code (ECC) unit, coupled to the microprocessor, wherein the ECC unit comprises:
an encoder, for receiving input data and encoding the received input data to generate a corresponding error correction code;
a self-test circuit, coupled to the encoder, the self-test circuit arranged for generating the input data to the encoder, receiving the error correction code from the encoder, and utilizing the input data and the error correction code to simulate a reading result of a page of a flash memory of the flash memory device to generate soft information; and
a decoder, coupled to the self-test circuit, the decoder arranged for directly receiving the soft information from the self-test circuit, without accessing the flash memory, and decoding the soft information to generate a decoding result.

13. The controller of claim 12, wherein the self-test circuit comprises:
a random data generator, arranged for generating a plurality of sets of random data as the input data; and
a noise generator, coupled to the random data generator, and arranged for adding noise component to the plurality of sets of random data and the error correction code, to stimulate the reading result of the page of the flash memory of the flash memory device to generate the soft information.

14. The controller of claim 13, wherein the random data generator utilizes a same seed data to generate the plurality of sets of random data, respectively; and each set of the plurality of sets of random data has same contents.

15. The controller of claim 14, wherein the noise generator simultaneously records positions and bit values of error bits while adding noise component to each of the plurality of sets of random data; and while the noise generator adds noise component to an $N^{th}$ set of random data, the noise generator refers to positions and bit values of error bits that are recorded when the noise generator adds noise component to $1^{st}$ to $(N-1)^{th}$ sets of random data, where N is an integer larger than 1.

16. The controller of claim 12, wherein the self-test circuit simulates the reading result of the page when a plurality of different voltage values are used to read the page respectively, to generate the soft information.

* * * * *